(12) United States Patent
Hou

(10) Patent No.: US 11,588,130 B2
(45) Date of Patent: Feb. 21, 2023

(54) ARRAY SUBSTRATE, METHOD OF MANUFACTURING THE SAME, AND DISPLAY DEVICE

(71) Applicant: BOE TECHNOLOGY GROUP CO., LTD., Beijing (CN)

(72) Inventor: Wenjun Hou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 182 days.

(21) Appl. No.: 17/272,290

(22) PCT Filed: Jun. 18, 2020

(86) PCT No.: PCT/CN2020/096876
§ 371 (c)(1),
(2) Date: Feb. 27, 2021

(87) PCT Pub. No.: WO2020/253793
PCT Pub. Date: Dec. 24, 2020

(65) Prior Publication Data
US 2021/0399256 A1    Dec. 23, 2021

(30) Foreign Application Priority Data

Jun. 19, 2019  (CN) .......................... 201910533607.9

(51) Int. Cl.
*H01L 51/52* (2006.01)
*H01L 27/32* (2006.01)
*H01L 51/56* (2006.01)

(52) U.S. Cl.
CPC ...... *H01L 51/5221* (2013.01); *H01L 27/3246* (2013.01); *H01L 27/3283* (2013.01);
(Continued)

(58) Field of Classification Search
None
See application file for complete search history.

(56) References Cited

U.S. PATENT DOCUMENTS

2016/0020404 A1   1/2016 Ito et al.
2017/0222149 A1*  8/2017 Nakadaira ........... H01L 51/0023
(Continued)

FOREIGN PATENT DOCUMENTS

CN   101165906 A   4/2008
CN   106409152 A   2/2017
(Continued)

OTHER PUBLICATIONS

First office action of Chinese application No. 201910533607.9 dated Dec. 21, 2020.
(Continued)

*Primary Examiner* — Michelle Mandala
(74) *Attorney, Agent, or Firm* — Fay Sharpe LLP

(57) ABSTRACT

Disclosed is an array substrate including a base substrate, and a first electrode, a pixel define layer, a light-emitting layer and a second electrode which are sequentially disposed on the base substrate. The pixel define layer has a plurality of openings each having two opposite surfaces. The two opposite surfaces include a first surface proximal to the base substrate and a second surface distal from the base substrate. The second surface is coplanar with a surface of the pixel define layer distal from the base substrate. An orthographic projection of the second surface on the base substrate is within an orthographic projection of the first surface on the base substrate. The pixel define layer includes a pixel define body and an electrode repairing material layer. The electrode repairing material layer is disposed on a side of the pixel define body, and repairs the second electrode.

20 Claims, 4 Drawing Sheets

(52) U.S. Cl.
CPC ........ *H01L 51/56* (2013.01); *H01L 2251/303* (2013.01); *H01L 2251/568* (2013.01)

(56) References Cited

U.S. PATENT DOCUMENTS

| | | | |
|---|---|---|---|
| 2019/0096969 A1 | 3/2019 | Zhang et al. | |
| 2019/0207149 A1 | 7/2019 | Yu | |
| 2020/0212371 A1 | 7/2020 | Hou | |
| 2021/0184167 A1* | 6/2021 | Liu | H01L 51/5253 |

FOREIGN PATENT DOCUMENTS

| | | | |
|---|---|---|---|
| CN | 107706317 A | 2/2018 | |
| CN | 108172605 A | 6/2018 | |
| CN | 109509782 A | 3/2019 | |
| CN | 110233169 A | 9/2019 | |
| JP | 2007095425 A | 4/2007 | |
| JP | 4826119 B2 | 11/2011 | |

OTHER PUBLICATIONS

Notification to grant patent right for invention of Chinese application No. 201910533607.9 dated May 7, 2021.

* cited by examiner

ARRAY SUBSTRATE, METHOD OF MANUFACTURING THE SAME, AND DISPLAY DEVICE

CROSS-REFERENCE TO RELATED APPLICATION

This application is a 371 of PCT Application No. PCT/CN2020/096876, filed on Jun. 18, 2020, which claims the benefit of priority to Chinese Application No. 201910533607.9, filed on Jun. 19, 2019, both of which are incorporated by reference herein.

TECHNICAL FIELD

The present disclosure relates to the field of photoelectric technologies, and in particular, relates to an array substrate, a method of manufacturing the same, and a display device.

BACKGROUND

An organic light-emitting diode (OLED) display has the characteristics of self-luminescence, fast response, wide view angle, high luminance, bright color, light weight, small thinness, and the like. Thus, the OLED display technology is considered as a next generation display technology.

SUMMARY

The present disclosure provides an array substrate, a method of manufacturing the same, and a display device.

In one aspect, an array substrate is provided. The array substrate includes a base substrate, and a first electrode, a pixel define layer, a light-emitting layer and a second electrode which are sequentially disposed on the base substrate, wherein the pixel define layer has a plurality of openings each having two opposite surfaces, the two opposite surfaces including a first surface proximal to the base substrate and a second surface distal from the base substrate, the second surface being coplanar with a surface of the pixel define layer distal from the base substrate, and an orthographic projection of the second surface on the base substrate being within an orthographic projection of the first surface on the base substrate;

wherein the pixel define layer includes a pixel define body and an electrode repairing material layer which are stacked, the electrode repairing material layer being disposed on a side of the pixel define body distal from the base substrate, and configured to repair the second electrode; and one electrode of the first and second electrodes is a cathode, and the other electrode is an anode.

Optionally, the electrode repairing material layer includes a microcapsule, wherein a cavity of the microcapsule is filled with an electrode material, and a part of a shell of the microcapsule is exposed from the surface of the pixel define layer distal from the base substrate.

Optionally, the electrode material is nano silver.

Optionally, a material for preparing the shell includes an organic polymer doped with titanium dioxide.

Optionally, a density of the organic polymer is less than a density of a material for preparing the pixel define body.

Optionally, the organic polymer includes at least one of polyamine, polyamide, polyimide, phenolic resin, polyurethane, polyolefin, and polysilane.

Optionally, the material for preparing the pixel define body includes at least one of fluorinated polymethylmethacrylate and fluorinated polyimide.

Optionally, a height of the pixel define layer ranges from 0.5 μm to 3 μm.

Optionally, a longitudinal section of the pixel define layer includes a plurality of inverted isosceles trapezoids, and is perpendicular to the base substrate.

Optionally, the second electrode is in contact with the electrode material in the electrode repairing material layer.

Optionally, the first electrode is an anode, and the second electrode is a cathode.

Optionally, the second electrode is a whole-layer structure.

Optionally, a material for preparing the shell includes an organic polymer doped with titanium dioxide; a density of the organic polymer is less than a density of a material for preparing the pixel define body; the organic polymer includes at least one of polyamine, polyamide, polyimide, phenolic resin, polyurethane, polyolefin, and polysilane; the material for preparing the pixel define body includes at least one of fluorinated polymethylmethacrylate and fluorinated polyimide; a longitudinal section of the pixel define layer includes a plurality of inverted isosceles trapezoids, and is perpendicular to the base substrate; the second electrode is in contact with the electrode material in the electrode repairing material layer; and the first electrode is an anode, and the second electrode is a cathode and is a whole-layer structure.

In another aspect, a display device is provided. The display device includes any one of the array substrates according to the above aspect.

Optionally, the display device is an organic light-emitting diode (OLED) display device.

In yet another aspect, a method of manufacturing an array substrate is provided. The method includes:

providing a base substrate;

forming a first electrode on the base substrate;

forming a pixel define layer on the base substrate on which the first electrode is formed; wherein the pixel define layer has a plurality of openings each having two opposite surfaces, the two opposite surfaces including a first surface proximal to the base substrate and a second surface distal from the base substrate, the second surface being coplanar with a surface of the pixel define layer distal from the base substrate, an orthographic projection of the second surface on the base substrate being within an orthographic projection of the first surface on the base substrate; and the pixel define layer includes a pixel define body and an electrode repairing material layer which are stacked, the electrode repairing material layer being disposed on a side of the pixel define body distal from the base substrate;

forming a light-emitting layer on the base substrate on which the pixel define layer is formed;

forming a second electrode on the base substrate on which the light-emitting layer is formed; and repairing the second electrode by using the electrode repairing material layer;

wherein one electrode of the first and second electrodes is a cathode, and the other electrode is an anode.

Optionally, forming the pixel define layer on the base substrate on which the first electrode is formed includes: forming, by using a liquefied material doped with a microcapsule, a liquefied material layer on the base substrate on which the first electrode is formed, wherein a cavity of the microcapsule is filled with an electrode material, and a density of a shell of the microcapsule is less than a density of the liquefied material; acquiring a solidified material layer by solidifying the liquefied material layer after a part of the shell of the microcapsule is exposed from a surface of the liquefied material layer distal from the base substrate; and acquiring the pixel define layer by patterning the solidified material layer through a patterning process.

Optionally, a material for preparing the shell includes an organic polymer doped with titanium dioxide; and repairing the second electrode by using the electrode repairing material layer includes: causing the shell of the microcapsule to break by irradiating a side of the pixel define layer distal from the base substrate with ultraviolet light such that the electrode material in the microcapsule flows out and is in contact with the second electrode.

Optionally, forming the second electrode on the base substrate on which the light-emitting layer is formed includes: forming the second electrode on an entire surface of the side of the pixel define layer distal from the base substrate by vapor deposition.

Optionally, the first electrode is an anode and the second electrode is a cathode, and forming the light-emitting layer on the base substrate on which the pixel define layer is formed includes: sequentially forming a hole injection layer, a hole transport layer and an organic light-emitting material layer in the openings of the pixel define layer by inkjet printing; and sequentially forming an electron transport layer and an electron injection layer on a side of the organic light-emitting material layer distal from the base substrate by vapor deposition.

DETAILED DESCRIPTION

For clearer descriptions of the objectives, technical solutions, and advantages of the present disclosure, embodiments of the present disclosure are described in detail hereinafter with reference to the accompanying drawings.

Methods of preparing organic material film layers in OLED displays mainly include vacuum deposition and solution process. The vacuum deposition is suitable for small organic molecules, requires no solvent for forming films having a uniform film thickness, but is unsuitable for production of large-size products due to a high equipment investment and a low material utilization rate. The solution process includes spin coating, inkjet printing, nozzle coating, and screen printing, which is suitable for polymer materials and soluble small molecules, features low equipment cost, and has merits in large-scale and large-size production. In the inkjet printing technology, an ink solution can be accurately jet to pixel regions. The inkjet printing technology is regarded as an important way to mass production of the large-size OLED displays since this technology achieves a high material utilization rate and is suitable for large-scale production.

However, when the organic material film layer in the OLED display is prepared by the inkjet printing technology, the ink may climb on the pixel define layer, which adversely affects uniformity of a film formed by the ink in the pixel region, thereby adversely affecting a display effect of the OLED display.

Figure 1:
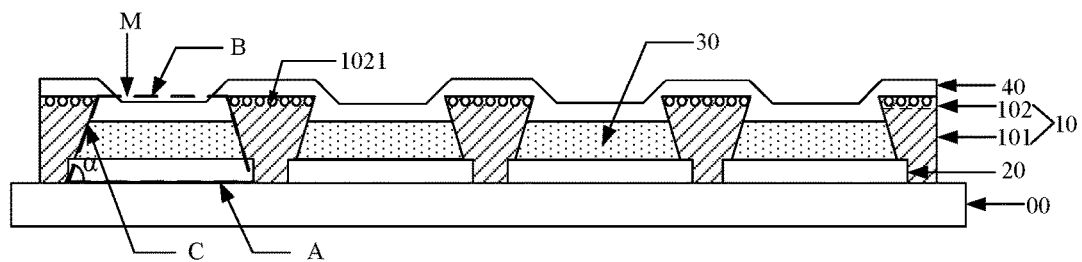
FIG. 1 is a schematic structure diagram of an array substrate according to an embodiment of the present disclosure.

FIG. 1 is a schematic structure diagram of an array substrate according to an embodiment of the present disclosure. As shown in FIG. 1, the array substrate includes a base substrate 00, and first electrodes 20, a pixel define layer 10, a light-emitting layer 30 and a second electrode 40 which are sequentially disposed on the base substrate 00. One of the first electrode 20 and the second electrode 40 is a cathode, and the other electrode is an anode.

Referring to FIG. 1, the pixel define layer 10 has a plurality of openings M each having two opposite surfaces. The two opposite surfaces include a first surface A proximal to the base substrate 00, and a second surface B distal from the base substrate 00. The second surface B is coplanar with a surface of the pixel define layer 10 distal from the base substrate 00. The second surface B is an opening surface (a surface on a non-solid structure). Optionally, the opening M can be a via hole, thus the first surface A of the opening M is coplanar with a surface of the pixel define layer 10 proximal to the base substrate 00. An orthographic projection of the second surface B on the base substrate 00 is within an orthographic projection of the first surface A on the base substrate 00. That is, an angle α between the side surface C of the opening M and the first surface A is an acute angle. In an exemplary embodiment, referring to FIG. 1, a longitudinal section of the pixel define layer 10 includes a plurality of inverted isosceles trapezoids, and is perpendicular to the base substrate 00. Alternatively, the longitudinal section of the pixel define layer 10 may also include inverted trapezoids of another shape. For example, a length of one lateral side of the inverted trapezoid is greater than a length of the other lateral side, which is not limited in the embodiments of the present disclosure.

Each of the openings M of the pixel define layer 10 corresponds to one pixel region. That is, one sub-pixel is formed in each opening. For example, the sub-pixel may be a red sub-pixel, a green sub-pixel, or a blue sub-pixel. Since the angle between the side surface of the opening of the pixel define layer and the first surface is an acute angle, the side surface and the first electrodes disposed in the openings form a capillary structure. In a subsequent inkjet printing process, a solution can be spread relatively evenly under the effect of the capillary structure. Further, when the inkjet printing is performed in the opening, the ink is unlikely to climb on the side surface to the surface of the pixel define layer distal from the base substrate, such that the ink is effectively prevented from climbing, reducing a probability of occurrence of a coffee ring effect in the film layer, and improving the uniformity of a film formed by the ink in the pixel region.

Continuously referring to FIG. 1, the pixel define layer 10 includes a pixel define body 101 and an electrode repairing material layer 102 which are stacked. The electrode repairing material layer 102 is disposed on a side of the pixel define body 101 distal from the base substrate 00, and repairs the second electrode 40.

Optionally, the second electrode 40 is in contact with the electrode material in the electrode repairing material layer 102. Referring to FIG. 1, the second electrode 40 is a whole-layer structure.

Since the angle between the side surface of the opening of the pixel define layer and the first surface is an acute angle, it is likely to cause faults to the second electrode prepared in the whole layer on the side of the pixel define layer distal from the base substrate at an intersection between the side surface of the opening and the second surface, resulting in an open circuit defect. In the embodiment of the present disclosure, the electrode repairing material layer is formed on the surface of the pixel define body distal from the base substrate, and can repair fracture positions of the second electrode, such that yield and reliability of the subsequently prepared array substrate are improved.

In the embodiment of the present disclosure, an example is taken for illustration in which the first electrode is the anode and the second electrode is the cathode. The light-emitting layer 30 includes a hole injection layer (HIL), a hole transport layer (HTL), an organic light-emitting material layer, an electron transport layer (ETL), and an electron injection layer (EIL) which are sequentially disposed in a direction distal from the base substrate 00.

In summary, in the array substrate according to the embodiment of the present disclosure, since the angle between the side surface of the opening of the pixel define layer and the first surface is an acute angle, the side surface and the first electrodes disposed in the openings form a capillary structure. In a subsequent inkjet printing process, a solution can be spread relatively evenly under the effect of the capillary structure. Further, when the inkjet printing is performed in the opening, the ink is unlikely to climb on the side surface to the surface of the pixel define layer distal from the base substrate, such that the ink is effectively prevented from climbing, thereby reducing a probability of occurrence of a coffee ring effect in the film layer, and improving the uniformity of a film formed by the ink in the pixel region. In addition, in the embodiment of the present disclosure, the electrode repairing material layer is formed on the surface of the pixel define body distal from the base substrate, and can repair fracture positions of the second electrode, such that the yield and the reliability of the subsequently prepared array substrate are improved.

Figure 2:
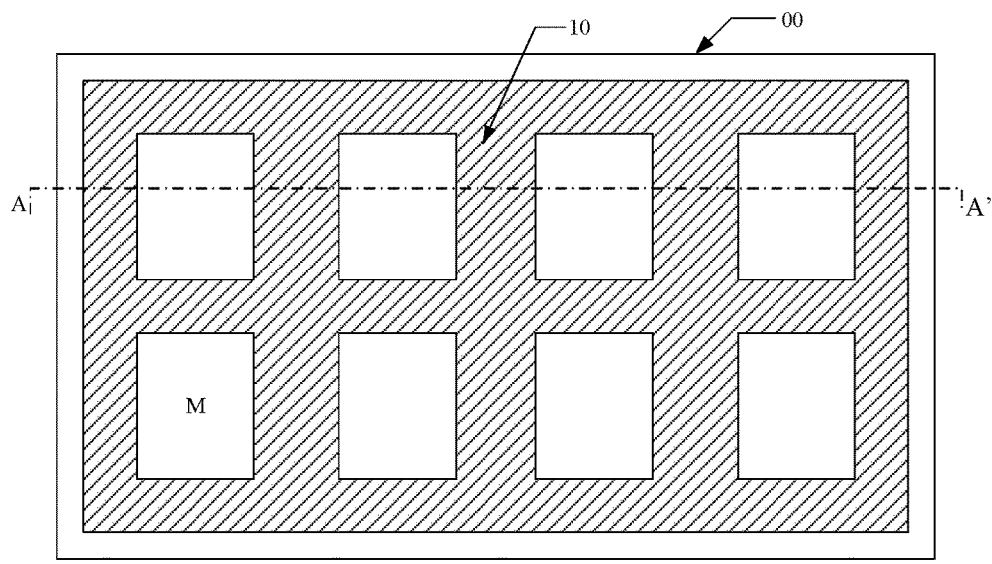
FIG. 2 is a schematic top view of a pixel define layer according to an embodiment of the present disclosure.

Optionally, FIG. 2 is a schematic top view of a pixel define layer according to an embodiment of the present disclosure. The pixel define layer 10 shown in FIG. 1 is a sectional view of the pixel define layer 10 in FIG. 2 at the position AA'. As shown in FIG. 2, the pixel define layer 10 has a plurality of openings M arranged in an array. For example, the plurality of openings M are uniformly spaced apart in both the row direction and the column direction. That is, the plurality of openings M are arranged in a matrix, such that uniform distribution of pixels is achieved.

Figure 3:
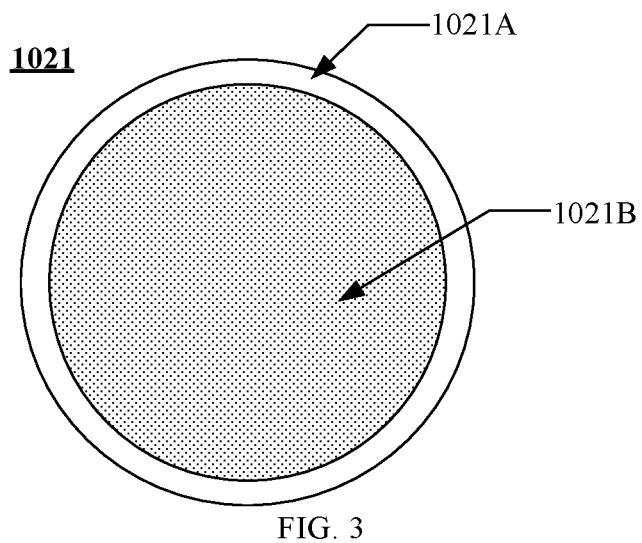
FIG. 3 is a schematic structure diagram of a microcapsule according to an embodiment of the present disclosure.

Optionally, please continue to refer to FIG. 1, the electrode repairing material layer 102 includes a plurality of microcapsules 1021. FIG. 3 is a schematic structure diagram of a microcapsule according to an embodiment of the present disclosure. As shown in FIG. 3, the microcapsule 1021 includes a shell 1021A, wherein a cavity is formed inside the shell 1021A, and is filled with an electrode material 1021B. A part of the shell 1021A is exposed from the surface of the pixel define layer 10 distal from the base substrate 00.

In the embodiment of the present disclosure, since the electrode repairing material layer includes the plurality of microcapsules, after the subsequent preparation of the second electrode at the whole layer on the side of the pixel define layer distal from the base substrate, the shell breaks such that the electrode material in the cavity flows to the surface of the pixel define layer distal from the base substrate. The second electrode at the intersection of the side surface of the opening and the second surface is repaired to ensure the conductivity of the second electrode, thereby improving the yield and the reliability of the subsequently prepared array substrate. By enabling the part of the shell of the microcapsule to be exposed from the surface of the pixel define layer distal from the base substrate, after the shell breaks, the electrode material in the cavity can smoothly flow to the surface of the pixel define layer distal from the base substrate.

Optionally, the electrode material is nano silver. The nano silver has the characteristics such as dimension effect, high surface energy, fine in particles, highly-flexible, resistant to friction, and excellent chemical stability, such that gaps between the second electrode parts are reduced, and a contact interface between the second electrode parts on the pixel define layer and the second electrode parts on the light-emitting layer is increased. This reduces a contact resistance therebetween, and thus improves the overall conductivity of the second electrode.

Optionally, a material for preparing the shell is an organic polymer doped with titanium dioxide. The organic polymer includes at least one of polyamine, polyamide, polyimide, phenolic resin, polyurethane, polyolefin, and polysilane. That is, the material for preparing the shell is any one or a combination of polyamine added with titanium dioxide, polyamide added with titanium dioxide, polyimide added with titanium dioxide, phenolic resin added with titanium dioxide, polyurethane added with titanium dioxide, polyolefin added with titanium dioxide, and polysilane added with titanium dioxide. As being doped with titanium dioxide, the shell may break under the irradiation of ultraviolet rays (UV), such that the electrode material in the shell can flow out. Thus, the operation is simple.

Optionally, a density of the organic polymer for preparing the shell of the microcapsule is less than a density of the material for preparing the pixel define body in the pixel define layer, such that the microcapsules can float up in the case that the liquefied material doped with the microcapsules is adopted to prepare the pixel define layer, and a part of the shell can be exposed from the surface of the pixel define layer (namely, the surface of the pixel define layer distal from the base substrate). Thus, the pixel define layer can be prepared through one-time patterning process, and the preparation process is simple.

Optionally, the material for preparing the pixel define body includes at least one of fluorinated polymethylmethacrylate and fluorinated polyimide.

Optionally, a height of the pixel define layer ranges from 0.5 µm to 3 µm. The height of the pixel define layer should not be too large, and an over-large height otherwise adversely affects the continuity of the vapor deposition of the second electrode, and it is necessary to deposit an excessively thick second electrode. The height of the pixel define layer should not be too small, and an over-small height allows the ink to pass over the pixel define layer when inkjet printing is performed in the pixel region. The height of the pixel define layer refers to a distance from the surface of the pixel define layer proximal to the base substrate to the surface of the pixel define layer distal from the base substrate.

In summary, in the array substrate according to the embodiment of the present disclosure, since the angle between the side surface of the opening of the pixel define layer and the first surface is an acute angle, the side surface and the first electrodes disposed in the openings form a capillary structure. In a subsequent inkjet printing process, a solution can be spread relatively evenly under the effect of the capillary structure. Further, when the inkjet printing is performed in the opening, the ink is unlikely to climb on the side surface to the surface of the pixel define layer distal from the base substrate, such that the ink is effectively prevented from climbing, thereby reducing a probability of occurrence of a coffee ring effect in the film layer, and improving the uniformity of a film formed by the ink in the pixel region. In addition, in the embodiment of the present disclosure, the electrode repairing material layer is formed on the surface of the pixel define body distal from the base substrate, and can repair fracture position(s) of the second electrode, such that the yield and the reliability of the subsequently prepared array substrate are improved.

The embodiments of the present disclosure further provide a display device, including the array substrate according to the embodiments of the present disclosure. The display device may be an OLED display device.

Optionally, the display device may include electronic paper, a mobile phone, a tablet computer, a TV, a display, a notebook computer, a digital photo frame, a navigator, or any other product or component having a display function.

Figure 4:
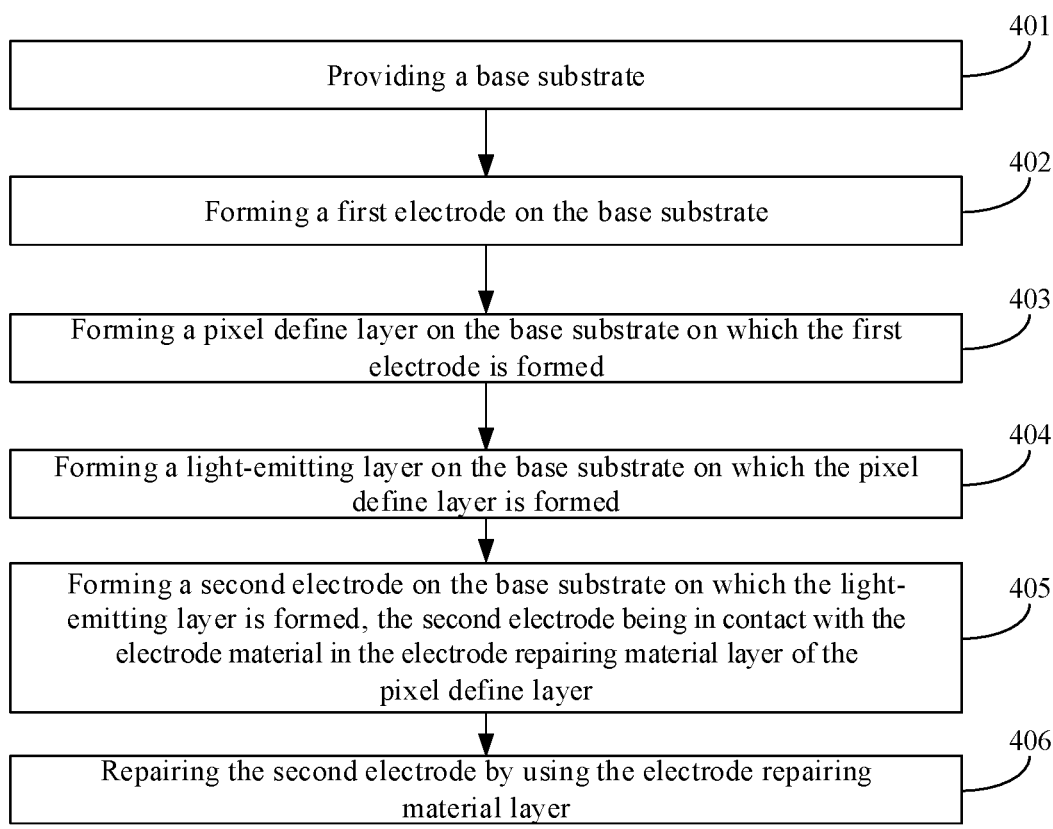
FIG. 4 is a flowchart of a method of manufacturing an array substrate according to an embodiment of the present disclosure.

FIG. 4 is a flowchart of a method of manufacturing an array substrate according to an embodiment of the present disclosure. As shown in FIG. 4, the method includes the following processes.

In 401, a base substrate is provided.

The base substrate may be a transparent base substrate, and specifically may be a base substrate made of a non-metallic light-guiding material having a prescribed hardness, such as glass, quartz or transparent resin.

In 402, first electrodes are formed on the base substrate.

Optionally, the patterned first electrodes are formed on a carrying surface of the base substrate by using indium tin oxide (ITO) through one-time patterning process. The patterning process includes: photoresist coating, exposing, developing, etching, and photoresist stripping.

In 403, a pixel define layer is formed on the base substrate on which the first electrodes are formed.

The pixel define layer has a plurality of openings each having two opposite surfaces. The two opposite surfaces include a first surface proximal to the base substrate and a second surface distal from the base substrate. The second surface is coplanar with a surface of the pixel define layer distal from the base substrate. An orthographic projection of the second surface on the base substrate is within an orthographic projection of the first surface on the base substrate. The pixel define layer includes a pixel define body and an electrode repairing material layer which are stacked. The electrode repairing material layer is disposed on a side of the pixel define body distal from the base substrate.

Figure 5:
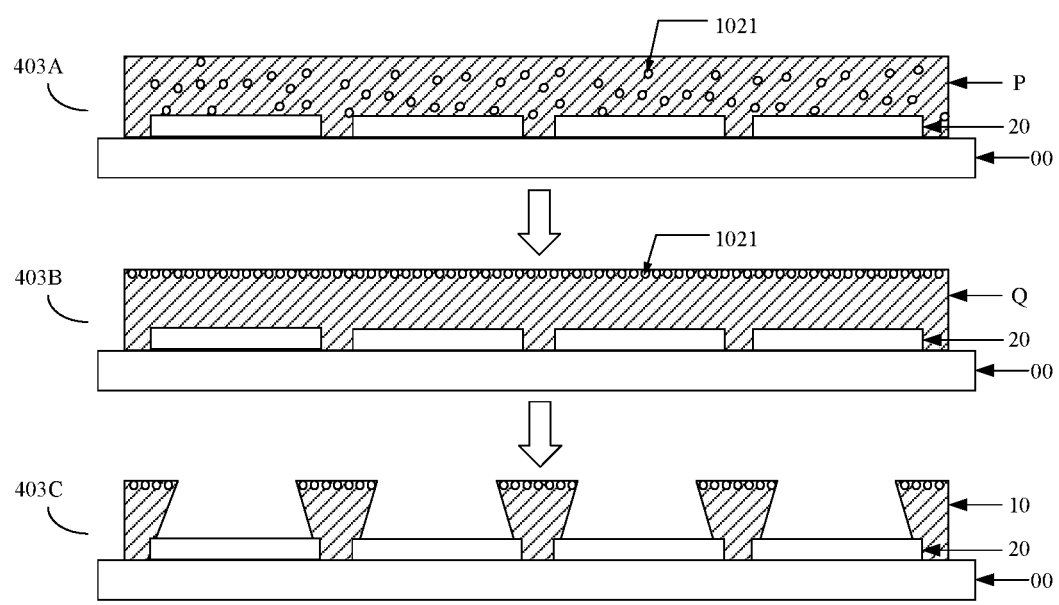
FIG. 5 is a schematic diagram of a process flow for forming a pixel define layer according to an embodiment of the present disclosure.

Optionally, step 403 includes 403A to 403C, and the process is shown in FIG. 5.

In 403A, a liquefied material layer P is formed on the base substrate 00 on which the first electrodes 20 are formed by using a liquefied material doped with the microcapsules 1021.

A cavity of each of the microcapsules is filled with an electrode material. A density of a shell of the microcapsule is less than a density of the liquefied material. The liquefied material layer may be formed on a side of the base substrate where the first electrodes are formed by coating. A thickness of the liquefied material layer ranges from 0.5 μm to 3 μm. The thickness of the liquefied material layer refers to a distance from a surface of the liquefied material layer distal from the base substrate to a surface of the liquefied material layer proximal to the base substrate.

Optionally, the electrode material is nano silver. The material for preparing the shell is an organic polymer doped with titanium dioxide. The organic polymer includes at least one of polyamine, polyamide, polyimide, phenolic resin, polyurethane, polyolefin, and polysilane. The liquefied material includes at least one of fluorinated polymethylmethacrylate and fluorinated polyimide.

In 403B, a solidified material layer Q is acquired by solidifying the liquefied material layer P after a part of the shell of the microcapsule 1021 is exposed from the surface of the liquefied material layer P distal from the base substrate 00.

Since the density of the shell of the microcapsule is less than the density of the liquefied material, after the formed liquefied material layer is allowed to stand for a period of time, the microcapsule floats up to the surface of the liquefied material layer. Thus, the shell of the microcapsule can be exposed from the surface of the liquefied material layer.

In 403C, the pixel define layer 10 is acquired by patterning process the solidified material layer Q.

Optionally, in the case that the liquefied material is a positive photoresist, areas of the solidified material layer that need to be exposed are opening areas (i.e., pixel regions) of the pixel define layer. The solidified material layer may be exposed from the side of the base substrate where the film layer is not formed. Since the photosensitive material can absorb a prescribed component of light, when a prescribed dose of light is adopted to expose the solidified material layer from the side of the base substrate where the film layer is not formed, the extent of exposure of the solidified material layer gradually decreases from the surface of the solidified material layer proximal to the base substrate to the surface of the solidified material layer distal from the base substrate. Further, in the developing process, the extent of reaction of the solidified material layer with a developer in a direction from near to distal to the base substrate is correspondingly reduced. That is, removed parts of the solidified material layer are gradually reduced in the direction from near to distal to the base substrate. Thus, the longitudinal section of the pixel define layer acquired after the developing process includes the plurality of inverted trapezoids as shown in FIG. 1.

In 404, a light-emitting layer is formed on the base substrate on which the pixel define layer is formed.

Optionally, the first electrode is an anode and the second electrode is a cathode. Step 404 includes 404A to 404B.

In 404A, a hole injection layer, a hole transport layer and an organic light-emitting material layer are sequentially formed in the openings of the pixel define layer by inkjet printing.

Referring to FIG. 1, since the angle between the side surface of the opening of the pixel define layer and the first surface is an acute angle, the side surface and the first electrodes disposed in the openings form a capillary structure. In the subsequent inkjet printing process, a solution can be spread relatively evenly under the effect of the capillary structure. Further, when the inkjet printing is performed in the opening, the ink is unlikely to climb on the side surface to the surface of the pixel define layer distal from the base substrate, such that the ink is effectively prevented from climbing, thereby reducing a probability of occurrence of a coffee ring effect in the film layer, and improving the uniformity of a film formed by the ink in the pixel region. That is, the film uniformity of the hole injection layer, the hole transport layer and the organic light-emitting material layer formed by the inkjet printing technology is improved.

In 404B, an electron transport layer and an electron injection layer are sequentially formed on a side of the organic light-emitting material layer distal from the base substrate by vapor deposition.

In 405, a second electrode is formed on the base substrate on which the light-emitting layer is formed, and is in contact with the electrode material in the electrode repairing material layer of the pixel define layer.

Optionally, the second electrode is formed on the entire surface of the side of the pixel define layer distal from the base substrate by vapor deposition. The first electrode and the second electrode are the anode and the cathode, or are the cathode and the anode.

In step 406, the second electrode is repaired by using the electrode repairing material layer.

Optionally, a material for preparing the shell of the microcapsule in the electrode repairing material layer is an organic polymer doped with titanium dioxide. After the second electrode is formed on the side of the pixel define layer distal from the base substrate, the shell of the microcapsule is caused to break by irradiating a side of the pixel define layer distal from the base substrate with ultraviolet light such that the electrode material in the microcapsule flows out and is in contact with the second electrode.

Since the angle between the side surface of the opening of the pixel define layer and the first surface is an acute angle, it is likely to cause faults to the second electrode prepared in the whole layer on the side of the pixel define layer distal from the base substrate at an intersection between the side surface of the opening and the second surface, resulting in an open circuit defect. In the embodiment of the present disclosure, the electrode repairing material layer is formed on the surface of the pixel define body distal from the base substrate, and can repair fracture positions of the second electrode, such that the yield and the reliability of the subsequently prepared array substrate are improved.

It should be noted that the order of the steps of the method of manufacturing the array substrate according to the embodiments of the present disclosure may be appropriately adjusted, and may be correspondingly increased or decreased as needed. Changed methods which can be easily derived by any person skilled in the art within the technical scope disclosed by the present disclosure should be covered by the protection scope of the present disclosed, which are not described herein any further.

In summary, in the method of manufacturing the array substrate according to the embodiment of the present disclosure, since the angle between the side surface of the pixel define layer and the first electrode disposed in the pixel region is an acute angle, the side surface of the pixel define layer and the first electrodes disposed in the pixel region form the capillary structure. In the inkjet printing process, the solution can be spread relatively evenly under the effect of the capillary structure. In addition, since the side surface of the pixel define layer is slanted, when the inkjet printing is performed in the pixel region, the ink is unlikely to climb on the side surface to the second surface of the pixel define layer distal from the base substrate, such that the ink is effectively prevented from climbing, thereby reducing a probability of occurrence of a coffee ring effect in the film layer, and improving the uniformity of a film formed by the ink in the pixel region. Moreover, since the angle between the side surface of the pixel define layer and the second surface is an acute angle, it is likely to cause faults to the second electrode prepared in the whole layer on the side of the pixel define layer distal from the base substrate at an intersection between the side surface of the pixel define layer and the second surface, resulting in an open circuit defect. In the embodiment of the present disclosure, the electrode repairing material layer is formed on the surface of the pixel define body distal from the base substrate, and can repair fracture positions of the second electrode, such that the yield and the reliability of the array substrate are improved.

It should be pointed out that in the drawings, the dimensions of layers and regions may be exaggerated for the clarity of illustration. Moreover, it can be understood that when an element or a layer is referred to as "on" another element or layer, the element or layer may be directly arranged on the other element, or there may be an intermediate layer. In addition, it can be understood that when an element or a layer is referred to as "under" another element or layer, the element or layer may be directly arranged under the other element, or there may be more than one intermediate layer or element. In addition, understandably, when a layer or an element is referred to as "between" two layers or two elements, the layer or element may be the only one layer between the two layers or the two elements, or there may be more than one intermediate layer or element. Similar reference numerals indicate similar elements throughout the text.

The terms "first" and "second" used in the present disclosure are merely configured to describe but not denote or imply any relative importance. The term "a plurality of" means two or more, unless otherwise expressly provided.

Obviously, the above embodiments of the present disclosure are only for the purpose of clearly explaining the examples of the present disclosure, not for the limitation of the embodiments of the present disclosure. For those of ordinary skill in the art, other changes or variations in different forms can be made based on the above description. It is impossible to enumerate all the embodiments. Any obvious changes or variations derived from the technical solutions of the present disclosure are still within the protection scope of the present disclosure.

What is claimed is:

1. An array substrate, comprising: a base substrate, and a first electrode, a pixel define layer, a light-emitting layer and a second electrode which are sequentially disposed on the base substrate, the pixel define layer having a plurality of openings each having two opposite surfaces, the two opposite surfaces comprising a first surface proximal to the base substrate and a second surface distal from the base substrate, the second surface being coplanar with a surface of the pixel define layer distal from the base substrate, and an orthographic projection of the second surface on the base substrate being within an orthographic projection of the first surface on the base substrate;

wherein the pixel define layer comprises a pixel define body and an electrode repairing material layer which are stacked, the electrode repairing material layer being disposed on a side of the pixel define body distal from the base substrate, and configured to repair the second electrode; and one electrode of the first electrode and the second electrode is a cathode, and the other electrode is an anode.

2. The array substrate according to claim 1, wherein the electrode repairing material layer comprises a microcapsule, a cavity of the microcapsule being filled with an electrode material, and a part of a shell of the microcapsule being exposed from the surface of the pixel define layer distal from the base substrate.

3. The array substrate according to claim 2, wherein the electrode material comprises nano silver.

4. The array substrate according to claim 2, wherein a material for preparing the shell comprises an organic polymer doped with titanium dioxide.

5. The array substrate according to claim 4, wherein a density of the organic polymer is less than a density of a material for preparing the pixel define body.

6. The array substrate according to claim 4, wherein the organic polymer comprises at least one of polyamine, polyamide, polyimide, phenolic resin, polyurethane, polyolefin, and polysilane.

7. The array substrate according to claim 1, wherein a material for preparing the pixel define body comprises at least one of fluorinated polymethylmethacrylate and fluorinated polyimide.

8. The array substrate according to claim 1, wherein a height of the pixel define layer ranges from 0.5 µm to 3 µm.

9. The array substrate according to claim 1, wherein a longitudinal section of the pixel define layer comprises a plurality of inverted isosceles trapezoids, and is perpendicular to the base substrate.

10. The array substrate according to claim 1, wherein the second electrode is in contact with an electrode material in the electrode repairing material layer.

11. The array substrate according to claim 1, wherein the first electrode is an anode, and the second electrode is a cathode.

12. The array substrate according to claim 1, wherein the second electrode is a whole-layer structure.

13. The array substrate according to claim 3, wherein
a material for preparing the shell comprises an organic polymer doped with titanium dioxide;
a density of the organic polymer is less than a density of a material for preparing the pixel define body;
the organic polymer comprises at least one of polyamine, polyamide, polyimide, phenolic resin, polyurethane, polyolefin, and polysilane;
a material for preparing the pixel define body comprises at least one of fluorinated polymethylmethacrylate and fluorinated polyimide;
a longitudinal section of the pixel define layer comprises a plurality of inverted isosceles trapezoids, and is perpendicular to the base substrate;
the second electrode is in contact with the electrode material in the electrode repairing material layer; and
the first electrode is an anode, and the second electrode is a cathode, and the second electrode is a whole-layer structure.

14. A display device, comprising: the array substrate according to claim 1.

15. The display device according to claim 14, wherein the display device is an organic light-emitting diode OLED display device.

16. A method of manufacturing an array substrate, comprising:
providing a base substrate;
forming a first electrode on the base substrate;
forming a pixel define layer on the base substrate on which the first electrode is formed, the pixel define layer having a plurality of openings each having two opposite surfaces, the two opposite surfaces comprising a first surface proximal to the base substrate and a second surface distal from the base substrate, the second surface being coplanar with a surface of the pixel define layer distal from the base substrate, an orthographic projection of the second surface on the base substrate being within an orthographic projection of the first surface on the base substrate, the pixel define layer comprising a pixel define body and an electrode repairing material layer which are stacked, the electrode repairing material layer being disposed on a side of the pixel define body distal from the base substrate;
forming a light-emitting layer on the base substrate on which the pixel define layer is formed;
forming a second electrode on the base substrate on which the light-emitting layer is formed; and
repairing the second electrode by using the electrode repairing material layer;
wherein one electrode of the first and second electrodes is a cathode, and the other electrode is an anode.

17. The method according to claim 16, forming the pixel define layer on the base substrate on which the first electrode is formed comprises:
forming, by using a liquefied material doped with a microcapsule, a liquefied material layer on the base substrate on which the first electrode is formed, wherein a cavity of the microcapsule is filled with an electrode material, and a density of a shell of the microcapsule is less than a density of the liquefied material;
acquiring a solidified material layer by solidifying the liquefied material layer after a part of the shell of the microcapsule is exposed from a surface of the liquefied material layer distal from the base substrate; and
acquiring the pixel define layer by patterning the solidified material layer.

18. The method according to claim 17, wherein a material for preparing the shell comprises an organic polymer doped with titanium dioxide; and repairing the second electrode by using the electrode repairing material layer comprises:
causing the shell of the microcapsule to break by irradiating a side of the pixel define layer distal from the base substrate with ultraviolet light such that the electrode material in the microcapsule flows out and is in contact with the second electrode.

19. The method according to claim 16, forming the second electrode on the base substrate on which the light-emitting layer is formed comprises:
forming the second electrode on an entire surface of the side of the pixel define layer distal from the base substrate by vapor deposition.

20. The method according to claim 16, wherein the first electrode is an anode and the second electrode is a cathode, and forming the light-emitting layer on the base substrate on which the pixel define layer is formed comprises:
sequentially forming a hole injection layer, a hole transport layer, and an organic light-emitting material layer in the openings of the pixel define layer by inkjet printing; and
sequentially forming an electron transport layer and an electron injection layer on a side of the organic light-emitting material layer distal from the base substrate by vapor deposition.

* * * * *